United States Patent
Yun et al.

(10) Patent No.: US 7,329,321 B2
(45) Date of Patent: Feb. 12, 2008

(54) ENHANCED WAFER CLEANING METHOD

(75) Inventors: Seokmin Yun, Pleasanton, CA (US);
John M. Boyd, Atascadero, CA (US);
Mark Wilcoxson, Oakland, CA (US);
John deLarios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/061,944

(22) Filed: Feb. 17, 2005

(65) Prior Publication Data

US 2006/0124153 A1  Jun. 15, 2006

Related U.S. Application Data

(63) Continuation-in-part of application No. 10/261,839, filed on Sep. 30, 2002, now Pat. No. 7,234,477.

(51) Int. Cl.
*B08B 1/02* (2006.01)

(52) U.S. Cl. .................. 134/15; 134/2; 134/6; 134/12; 134/26; 134/30; 134/33; 134/34; 134/32; 134/35; 134/902; 15/77

(58) Field of Classification Search .......... 15/77; 134/6, 26, 32, 33, 12, 2, 15, 902, 30, 34, 134/35

See application file for complete search history.

(56) References Cited

U.S. PATENT DOCUMENTS

| | | | |
|---|---|---|---|
| 2004/0060195 A1* | 4/2004 | Garcia et al. .................. 34/445 |
| 2004/0060581 A1* | 4/2004 | Garcia et al. .................. 134/30 |
| 2004/0069319 A1* | 4/2004 | Boyd et al. .................... 134/1.3 |
| 2004/0069326 A1* | 4/2004 | Woods et al. .................. 134/32 |
| 2004/0069329 A1* | 4/2004 | de Larios et al. ........... 134/95.2 |
| 2004/0178060 A1* | 9/2004 | Ravkin et al. ............... 204/232 |
| 2005/0145265 A1* | 7/2005 | Ravkin et al. ................ 134/21 |
| 2005/0145267 A1* | 7/2005 | Korolik et al. ............... 134/30 |
| 2005/0221621 A1* | 10/2005 | Mikhaylichenko et al. . 438/745 |

FOREIGN PATENT DOCUMENTS

WO  WO9916109  * 4/1999

* cited by examiner

*Primary Examiner*—Sharidan Carrillo
(74) *Attorney, Agent, or Firm*—Martine Penilla & Gencarella, LLP

(57) ABSTRACT

A method for removing post-processing residues in a single wafer cleaning system is provided. The method initiates with providing a first heated fluid to a proximity head disposed over a substrate. Then, a meniscus of the first fluid is generated between a surface of the substrate and an opposing surface of the proximity head. The substrate is linearly moved under the proximity head. A single wafer cleaning system is also provided.

13 Claims, 11 Drawing Sheets

ENHANCED WAFER CLEANING METHOD

CROSS REFERENCE TO RELATED APPLICATION

This is a continuation-in-part of a U.S. patent application Ser. No. 10/261,839, from which priority under 35 U.S.C. § 120 is claimed, entitled "Method and Apparatus for Drying Semiconductor Wafer Surfaces Using a Plurality of Inlets and Outlets Held in Close Proximity to the Wafer Surfaces" filed on Sep. 30, 2002 now U.S. Pat No. 7,234,477.

BACKGROUND

1. Field of the Invention

The present invention relates to semiconductor wafer cleaning and drying and, more particularly, to apparatuses and techniques for more efficiently removing residues from wafer surfaces after etch or ash operations.

2. Description of the Related Art

In the semiconductor chip fabrication process, it is well known that there is a need to clean and dry a wafer where a fabrication operation has been performed that leaves unwanted residues on the surfaces of wafers. Plasma etching operations and ashing operations may leave unwanted residues on a surface of a substrate. For example, in post dual damascene cleaning, both organic and inorganic residues remain present on the surface of the substrate after these operations. The organic residues may be remnants of the photoresist or intentionally produced by the reactants to protect the sidewalls of the features being formed during the etch process, while the inorganic remnants may be residues from sputtering operations or oxides of the lower metal interconnect layer. If not removed, the unwanted residual material and particles may cause, among other things, defects on the wafer surface and inappropriate interactions between metallization features. In some cases, such defects may cause the subsequent metal interconnect layer to develop voids in the metal lines or high resistance, or even voids, at the contact interface between current and previous metal layers, and hence the devices on the wafer to become inoperable. In order to avoid the undue costs of discarding wafers having inoperable devices, it is therefore necessary to clean the wafer adequately after fabrication operations that leave unwanted residues.

FIG. 1 is a simplified schematic diagram of a single wafer cleaning system utilizing a spray system for distributing a cleaning agent. Cleaning fluid is dispersed onto wafer 10 through nozzle 14. Typically wafer 10 is rotating while the fluid is being spayed. The initial spread of the cleaning fluid, depicted by region 12, is unevenly distributed. In addition, because of the centrifugal force from the rotation of wafer 10, the center region of the wafer is associated with a low mass transport of the fluid at the substrate/fluid interface due to the lower velocity of the fluid at the center of the wafer. However, the peripheral region of wafer 10 is associated with a high mass transport, due to the higher velocity of the fluid. Further exacerbating the cleaning consistency is that the residence time for the cleaning fluid with the surface of wafer 10 is not uniform across the wafer during initial dispense until the fluid is uniformly distributed across the substrate. That is, the center region of wafer 10, where the cleaning fluid is initially applied, has a high residence time, while the peripheral region has a low residence time. Thus, in cases where the substrate is sensitive to activity of the fluid being applied, i.e., residence time, the higher residence time regions may be prone to damage of the layer below the residues, i.e., the interconnect dielectric material, or the lower residence time regions may not be properly cleaned of residue.

Therefore, there is a need for a method and an apparatus that allows for consistent cleaning of post etch residues without damaging the underlying layer.

SUMMARY

Broadly speaking, the present invention fills these needs by providing a cleaning and drying apparatus that is capable of removing unwanted residues from the surface of a substrate without adversely affecting the layer on which the residues are deposited. It should be appreciated that the present invention can be implemented in numerous ways, including as a process, an apparatus, a system, a device or a method. Several inventive embodiments of the present invention are described below.

In one embodiment, a method for removing post processing residues in a single wafer cleaning system is provided. The method initiates with providing a first fluid to a proximity head disposed over a substrate. Then, a meniscus of the first fluid is generated between a surface of the substrate and an opposing surface of the proximity head. The first fluid is heated and the substrate is linearly moved under the proximity head.

In another embodiment, a method for removing post etch residues in a single wafer cleaning system is provided. The method initiates with providing a fluid to a proximity head disposed over a substrate. Then, a meniscus of the fluid is generated between a surface of the substrate and an opposing surface of the proximity head. The fluid is heated and a substantially constant residence time of less than 30 seconds is maintained for the fluid over the surface of the substrate.

In yet another embodiment, a single wafer cleaning system is provided. The cleaning system includes a fluid source and a proximity head operably connected to the fluid source. The system further includes a substrate support configured to support a substrate disposed thereon. The substrate support is capable of moving the substrate under the proximity head to form a meniscus of fluid between opposing surfaces of the proximity head and the substrate. A controller is included. The controller is in communication with the substrate support. The controller defines a residence time of the meniscus of the fluid over the surface of the substrate through movement of the substrate support.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

Figure 1:
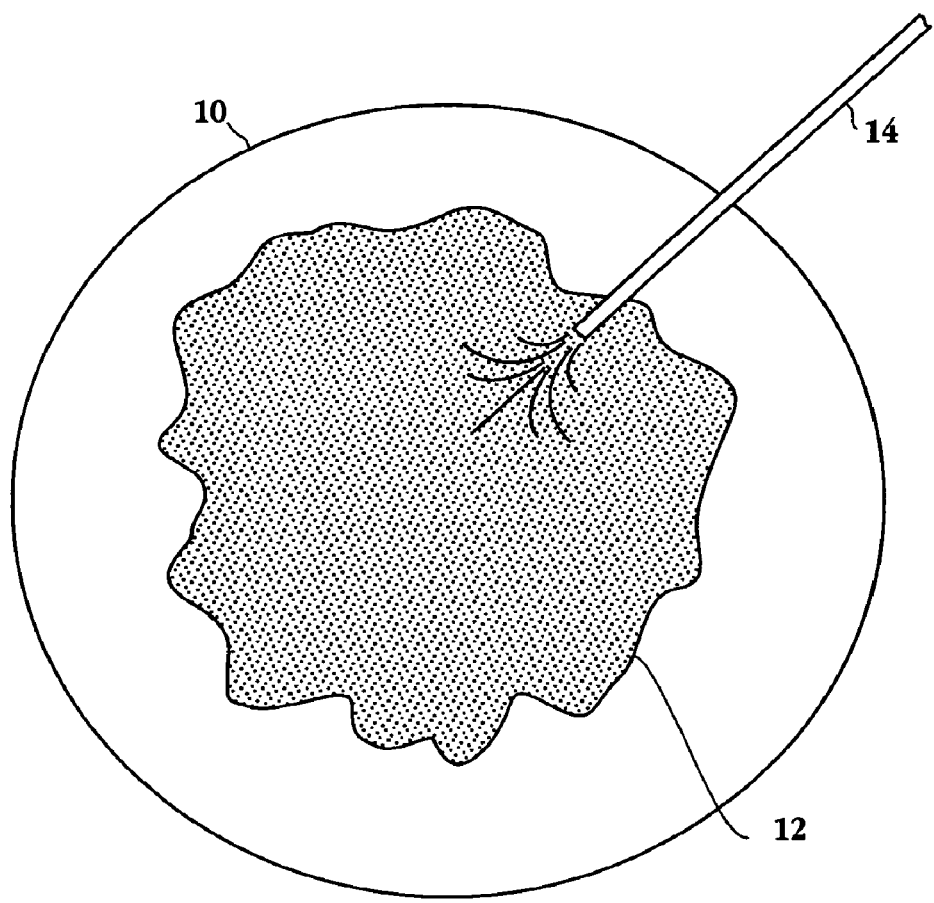
FIG. 1 illustrates movement of cleaning fluids on a wafer during a rotary spin, rinse and dry (SRD) cleaning and drying process.

An invention for methods and apparatuses for effectively cleaning process residues from a wafer is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferred embodiments, it will be appreciated that those skilled in the art that various alterations, additions, permutations and equivalents thereof may be realized. It is therefore intended that the present invention includes all such alterations, additions, permutations, and equivalents as fall within the true spirit and scope of the invention.

Various systems and methods of processing a surface of semiconductor wafers or other substrates, using a proximity head to manipulate one or more dynamic liquid meniscus have been described in the following co-pending, co-owned patent applications, each of which is incorporated by reference in their entirety for all purposes: U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces." Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus," each of which are incorporated by reference. Further embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," U.S. Pat. No. 6,488,040, issued on Dec. 3, 2002, entitled "Capillary Proximity Heads For Single Wafer Cleaning And Drying," U.S. Pat. No. 6,616,772, issued on Sep. 9, 2003, entitled "Methods For Wafer Proximity Cleaning And Drying," and U.S. patent application Ser. No. 10/742,303 entitled "Proximity Brush Unit Apparatus and Method," each of which are incorporate by reference. Additional embodiments and uses of the proximity head are further described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer," which are hereby incorporated by reference in their entirety.

It should be appreciated that the system described herein is exemplary, and that any other suitable types of configurations that would enable movement of the proximity head(s) into close proximity to the wafer may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, etc. The motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. Alternatively, the wafer may move under a stationary proximity head. In addition, the proximity head and the wafer cleaning and drying system described herein may be utilized to clean and dry any shape and size of substrates such as for example, 200 mm wafers, 300 mm wafers, flat panels, etc. The wafer cleaning and drying system may be utilized for either or both cleaning and drying the wafer depending on the configuration of the system.

Figure 2A:
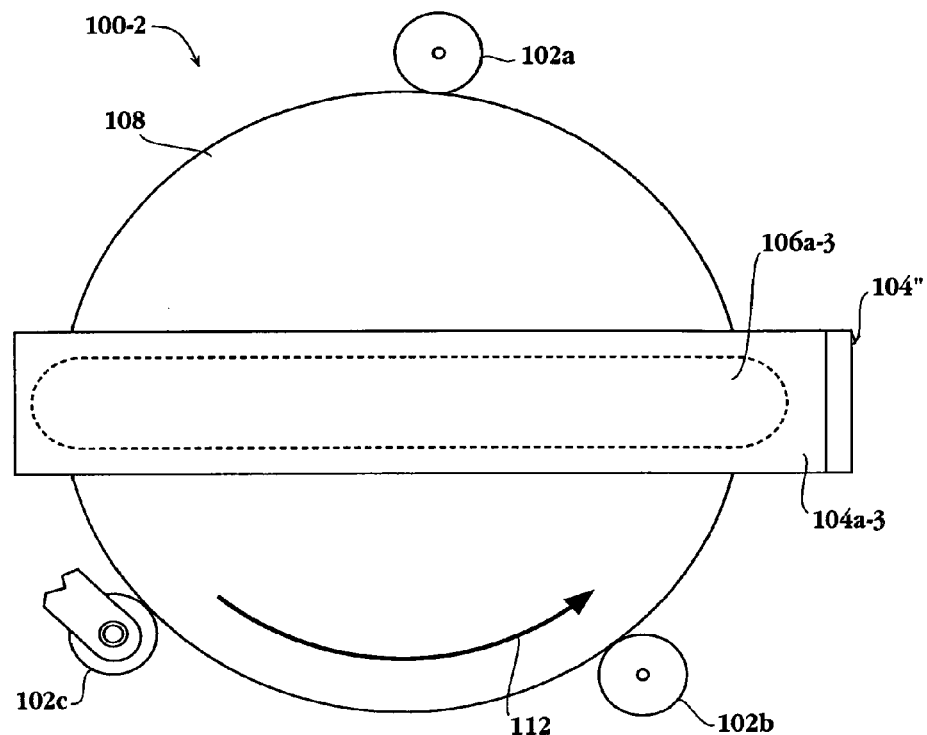
FIG. 2A shows a top view of a wafer cleaning and drying system with a proximity head in a horizontal configuration which extends across a diameter of the wafer 108 in accordance with one embodiment of the present invention.

FIG. 2A shows a top view of a wafer cleaning and drying system 100-2 with proximity head 106a-3 in a horizontal configuration which extends across a diameter of wafer 108 in accordance with one embodiment of the present invention. In this embodiment, proximity head 106a-3 is held by an upper arm 104a-3 that extends across a diameter of the wafer 108. Proximity head 106a-3 may be moved into a cleaning/drying position by vertical movement of the upper arm 104a-3 so the proximity head can be in a position that is in close proximity to wafer 108. Once proximity head 106a-3 is in close proximity to a top surface of wafer 108, the wafer processing operation of a top surface of the wafer can take place.

Figure 2B:
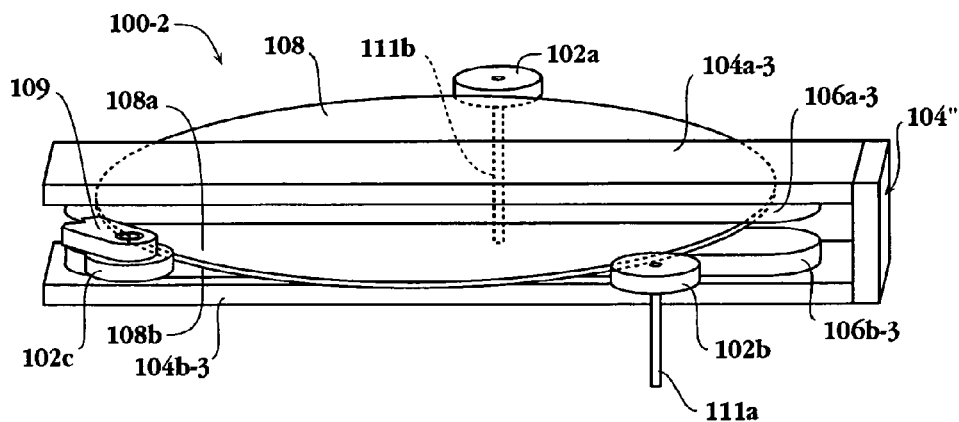
FIG. 2B shows a side view of a wafer cleaning and drying system with the proximity heads in a horizontal configuration which extends across a diameter of the wafer in accordance with one embodiment of the present invention.

FIG. 2B shows a side view of a wafer cleaning and drying system 100-2 with proximity heads 106a-3 and 106b-3 in a horizontal configuration, which extends across a diameter of wafer 108 in accordance with one embodiment of the present invention. In this embodiment, proximity head 106a-3 and proximity head 106b-3 both are elongated to be able to span the diameter of wafer 108. Here, while the wafer 108 is being rotated, proximity heads 106a-3 and 106b-3 are brought to close proximity of wafer surfaces 108a and 108b by top arm 104a and bottom arm 106b-3 respectively. Because proximity heads 106a-3 and 106b-3 extend across wafer 108, only half of a full rotation may be needed to clean/dry wafer 108.

Figure 2C:
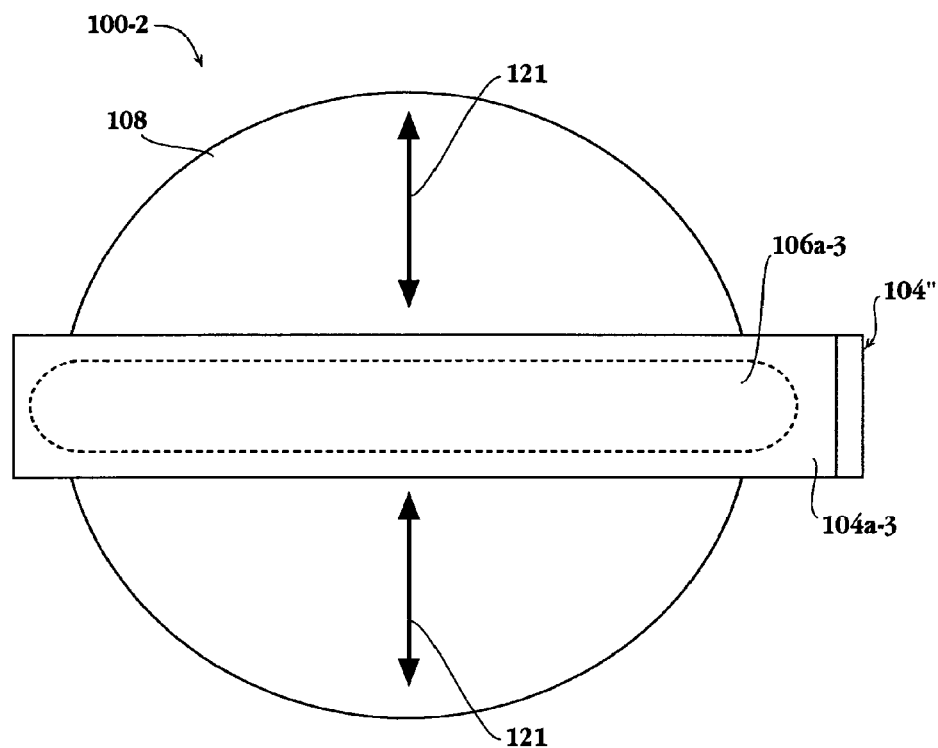
FIG. 2C shows a top view of a wafer cleaning and drying system with the proximity heads in a horizontal configuration which is configured to clean and/or dry the wafer in accordance with one embodiment of the present invention.

FIG. 2C shows a top view of a wafer cleaning and drying system 100-3 with proximity heads 106a-3 and 106b-3 in a horizontal configuration, which is configured to clean and/or dry wafer 108 in accordance with one embodiment of the present invention. In this embodiment, wafer 108 may be held stationary by any suitable type of wafer holding device such as, for example, an edge grip, fingers with edge attachments, etc. Proximity head carrier assembly 104''' is configured to be movable from one edge of wafer 108 across the diameter of the wafer to an edge on the other side of the wafer after crossing the entire wafer diameter. In this fashion, proximity head 106a-3 and/or proximity head 106b-3 (as shown below in reference to FIG. 2D) may move across the wafer following a path along a diameter of wafer 108 from one edge to an opposite edge. It should be appreciated that proximity heads 106a-3 and/or 106b-3 may be moved in any suitable manner that would enable moving from one edge of wafer 108 to another diametrically opposite edge. In one embodiment, proximity head 106a-3 and/or proximity head 106b-3 may move in directions 121 (e.g., top to bottom or bottom to top of FIG. 2C). Therefore, wafer 108 may stay stationary without any rotation or movement and proximity heads 106a-3 and/or proximity head 106b-3 may move into close proximity of the wafer and, through one pass over the wafer, clean/dry the top and/or bottom surface of the wafer. Alternatively, proximity heads 106a-3 and 106b-3 may be stationary while wafer 108 moves in the direction of arrows 121. Here, a substrate support, e.g., an edge grip, fingers with edge attachments, etc., is connected to a drive system that moves the substrate under the proximity head.

Figure 2D:
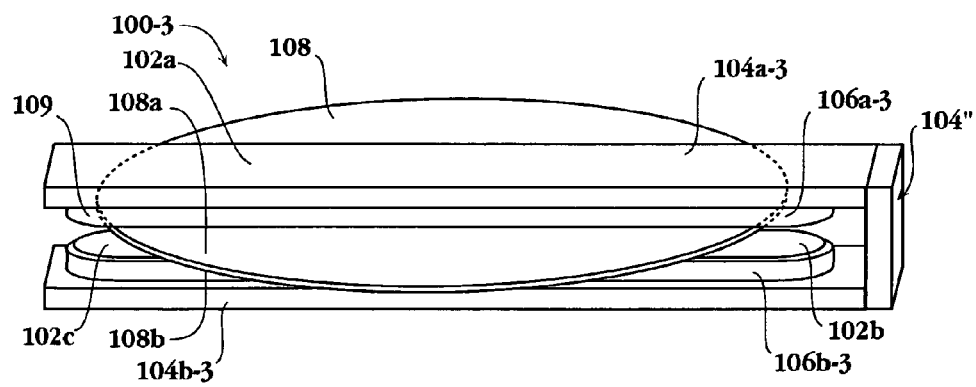
FIG. 2D shows a side view of a wafer cleaning and drying system with the proximity heads in a horizontal configuration which is configured to clean and/or dry the wafer in accordance with one embodiment of the present invention.

FIG. 2D shows a side view of a wafer cleaning and drying system 100-3 with proximity heads 106a-3 and 106b-3 in a horizontal configuration, which is configured to clean and/or dry wafer 108 in accordance with one embodiment of the present invention. In this embodiment, proximity head 106a-3 is in a horizontal position with wafer 108 also in a horizontal position. By use of proximity head 106a-3 and proximity head 106b-3 that spans at least the diameter of wafer 108, the wafer may be cleaned and/or dried in one pass by moving proximity heads 106a-3 and 106b-3 in direction 121 as discussed in reference to FIG. 2C. Of course, proximity heads 106a-3 and 106b-3 may remain stationary and wafer 108 may move under/between the proximity head(s).

Figure 3:
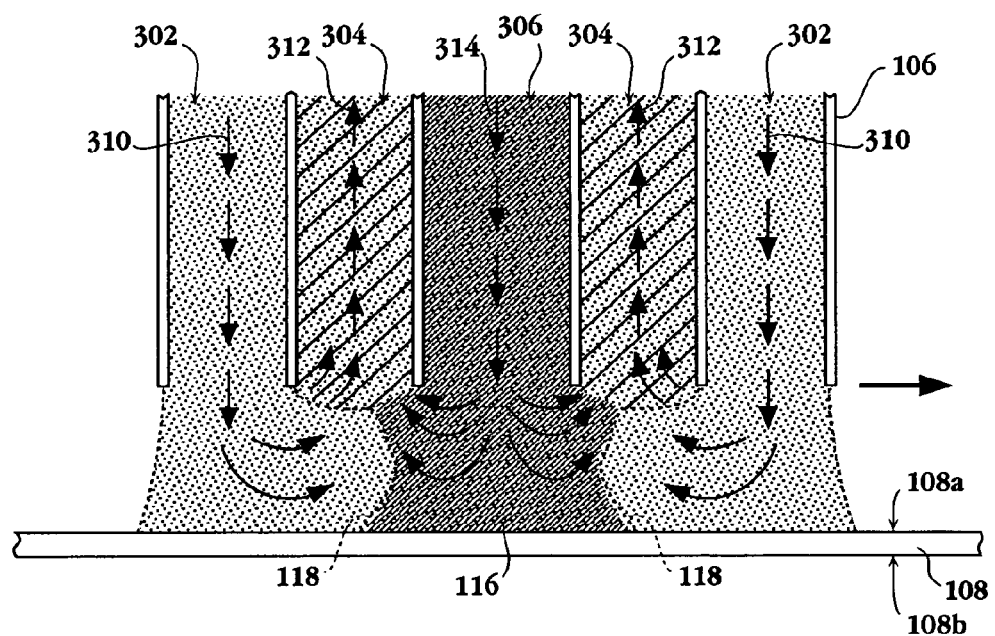
FIG. 3 illustrates a wafer cleaning/drying process that may be conducted by a proximity head in accordance with one embodiment of the present invention.

FIG. 3 illustrates a wafer cleaning/drying process that may be conducted by proximity head 106a in accordance with one embodiment of the present invention. Although FIG. 3 shows top surface 108a being cleaned, it should be appreciated that the wafer drying process may be accomplished in substantially the same way for bottom surface 108b of wafer 108. In one embodiment, source inlet 302 may be utilized to apply isopropyl alcohol (IPA) vapor toward top surface 108a of wafer 108, and source inlet 306 may be utilized to apply a cleaning chemistry or deionized water (DIW) toward top surface 108a of wafer 108. In addition, source outlet 304 may be utilized to apply vacuum to a region in close proximity to the wafer surface to remove fluid or vapor that may located on or near top surface 108a. It should be appreciated that any suitable combination of source inlets and source outlets may be utilized as long as at least one combination exists where at least one source inlet 302 is adjacent to at least one source outlet 304, which is in turn adjacent to at least one source inlet 306. The IPA may be in any suitable form such as, for example, IPA vapor where IPA in vapor form is input through use of a non-reactive gas, such as nitrogen ($N_2$) gas. It should be appreciated that although DIW is mentioned herein, any other suitable fluid may be utilized that may enable or enhance the wafer processing such as, for example, water purified in other ways, cleaning fluids, etc. In one embodiment, IPA inflow 310 is provided through source inlet 302, vacuum 312 may be applied through source outlet 304 and cleaning chemistry/DIW inflow 314 may be provided through source inlet 306. Consequently, if a fluid film resides on wafer 108, a first fluid pressure may be applied to the wafer surface by IPA inflow 310, a second fluid pressure may be applied to the wafer surface by chemistry/DIW inflow 314, and a third fluid pressure may be applied by vacuum 312 to remove the chemistry/DIW, IPA and the fluid film on the wafer surface.

Therefore, in one embodiment, as inflow 314 and inflow 310 is applied toward a wafer surface, any fluid/residue on the wafer surface is intermixed with the DIW inflow 314. At this time, inflow 314 that is applied toward the wafer surface encounters inflow 310. The IPA forms an interface 118 (also known as an IPA/DIW interface 118) with inflow 314 and along with vacuum 312 assists in the removal of the 314 along with any other fluid/residue from the surface of wafer 108. In one embodiment, the IPA/DIW interface 118 reduces the surface of tension of the chemistry/DIW. In operation, the chemistry/DIW is applied toward the wafer surface and almost immediately removed along with fluid on the wafer surface by the vacuum applied by the source outlet 304. The chemistry/DIW that is applied toward the wafer surface and for a moment resides in the region between a proximity head and the wafer surface along with any fluid on the wafer surface forms meniscus 116 where the borders of the meniscus are the IPA/DIW interfaces 118. Therefore, meniscus 116 is a constant flow of fluid being applied toward the surface and being removed at substantially the same time with any fluid on the wafer surface. The pressure (which is caused by the flow rate of the IPA) of the downward injection of IPA also helps contain meniscus 116.

The flow rate of the $N_2$ carrier gas containing the IPA may assist in causing a shift or a push of water flow out of the region between the proximity head and the wafer surface and into the source outlets 304 (suction outlets) through which the fluids/residues may be output from the proximity head. It is noted that the push of water flow is not a process requirement but can be used to optimize meniscus boundary control. Therefore, as the IPA and the chemistry/DIW is pulled into source outlets 304, the boundary making up the IPA/DIW interface 118 is not a continuous boundary because gas (e.g., air) is being pulled into source outlets 304 along with the fluids. In one embodiment, as the vacuum from source outlet 304 pulls the DIW, IPA, and the fluid on the wafer surface, the flow into the source outlet 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/DIW interface 118. It should also be understood that the any suitable number of source inlets 302, source outlets 304 and source inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the $N_2$/IPA, DIW, and vacuum as long as the meniscus 116 can be maintained. In one embodiment, the flow rate of the chemistry/DIW through a set of the source inlets 306 is between about 25 ml per minute to about 3,000 ml per minute. In a preferable embodiment, the flow rate of the chemistry/DIW through the set of the source inlets 306 is about 40 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more source inlets 302 and 306 and source outlets 304.

In one embodiment, the flow rate of the $N_2$/IPA vapor through a set of the source inlets 302 is between about 1 standard cubic feet per hour (SCFH) to about 100 SCFH. In a preferable embodiment, the IPA flow rate is between about 5 and 50 SCFH. In another embodiment, the flow rate for the vacuum through a set of the source outlets 304 is between about 10 standard cubic feet per hour (SCFH) to about 1250 SCFH. In a preferable embodiment, the flow rate for a vacuum though the set of the source outlets 304 is about 350 SCFH. In an exemplary embodiment, a flow meter may be utilized to measure the flow rate of the $N_2$/IPA, DIW, and the vacuum. The cleaning chemistries employed with the embodiments described herein include any suitable commercially available single wafer cleaning chemistry, such as those available from ATMI Incorporated of Danbury Conn.

Figure 4A:
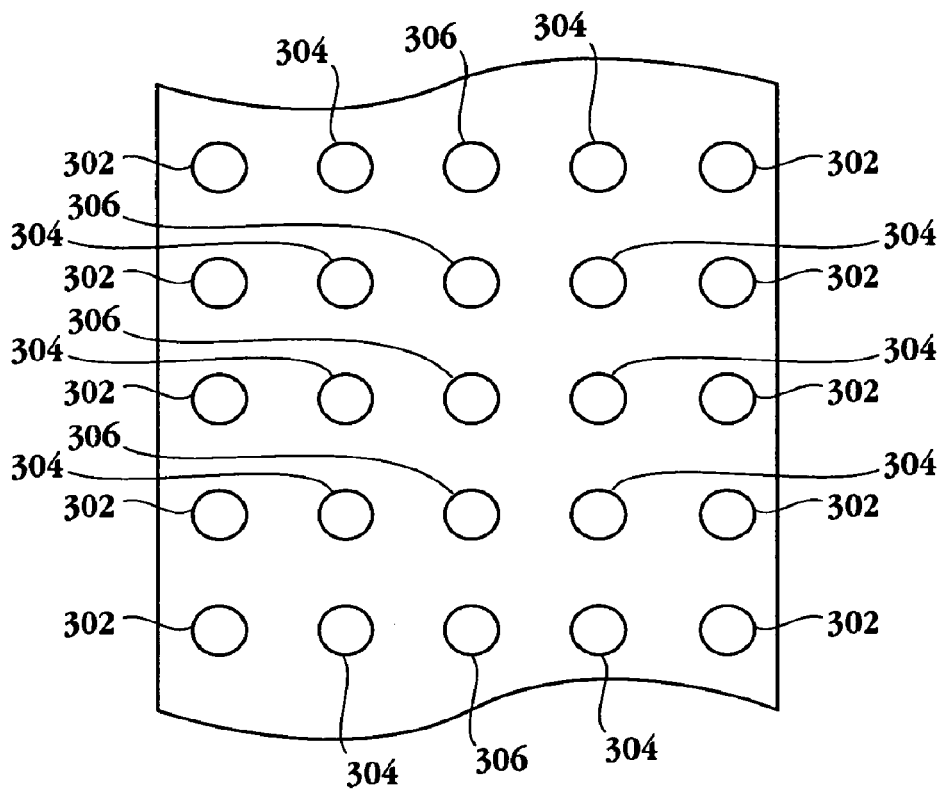
FIG. 4A shows a top view of a portion of a proximity head in accordance with one embodiment of the present invention.

FIG. 4A shows a top view of a portion of a proximity head 106 in accordance with one embodiment of the present invention. In the top view of one embodiment, from left to right are a set of the source inlet 302, a set of the source outlet 304, a set of the source inlet 306, a set of the source outlet 304, and a set of the source inlet 302. Therefore, as $N_2$/IPA and chemistry/DIW are input into the region between the proximity head 106 and the wafer 108, the vacuum removes the $N_2$/IPA and the chemistry/DIW along with any fluid film that may reside on the wafer 108. The source inlets 302, the source inlets 306, and the source outlets 304 described herein may also be any suitable type of geometry such as for example, circular opening, triangle opening, square opening, etc. In one embodiment, the source inlets 302 and 306 and the source outlets 304 have circular openings.

Figure 4B:
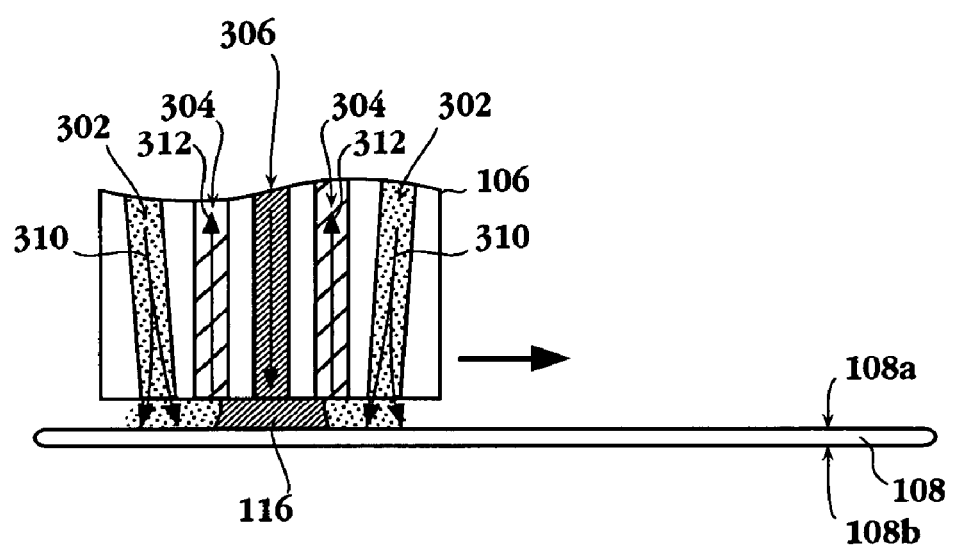
FIG. 4B illustrates a proximity head with angled source inlets performing a drying operation in accordance with one embodiment of the present invention.

FIG. 4B illustrates a proximity head 106 with angled source inlets 302' performing a drying operation in accordance with one embodiment of the present invention. It should be appreciated that the source inlets 302' and 306 and the source outlet(s) 304 described herein may be angled in any suitable way to optimize the wafer cleaning and/or drying process. In one embodiment, the angled source inlets 302' that input IPA vapor onto the wafer 108 is angled toward the source inlets 306 such that the EPA vapor flow is directed to contain the meniscus 116. It should be appreciated that while vacuum is mentioned in the above embodiments, the use of vacuum is optional.

Figure 5A:
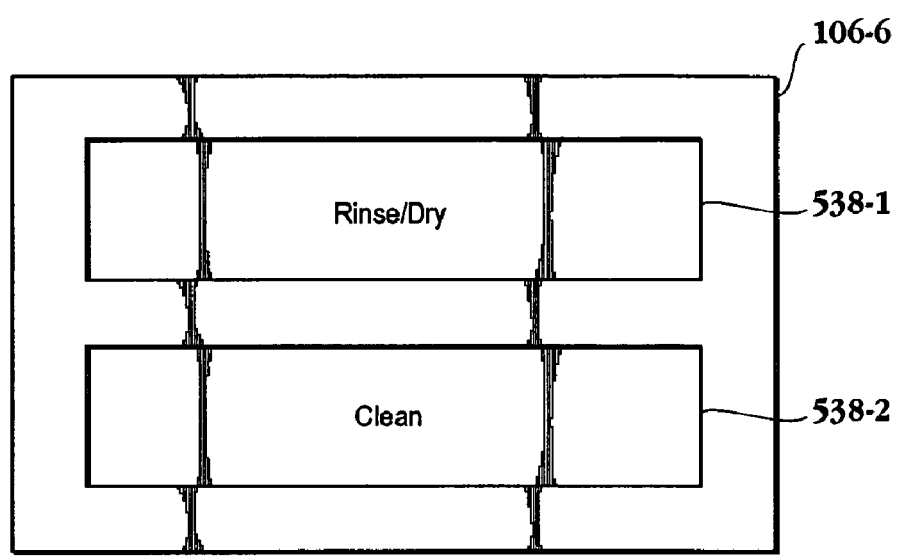
FIG. 5A shows a multi-process window proximity head in accordance with one embodiment of the present invention.

FIG. 5A shows a multi-process window proximity head 106-6 in accordance with one embodiment of the present invention. The proximity head 106-6 includes two process windows 538-1 and 538-2. In one embodiment, the process window 538-2 may use cleaning fluids suitable for a single wafer cleaning operation, instead of DIW to clean wafers. The process window 538-2 may use any suitable configuration of source inlets and outlets that may apply any suitable type of cleaning fluid to the wafer. In one embodiment, the process window 538-2 may include only source inlets that may apply the cleaning fluid. In another embodiment, the process window 538-2 may include other configurations and functions of source inlets and outlets described herein.

The process window 538-1 may then dry the wafer. The process window 538-1 may use any suitable configurations of source inlets and source outlets consistent with the configurations and functions described herein for drying a wafer surface. Therefore, by use of multiple process windows multiple functions such as cleaning and drying may be accomplished by one proximity head. In yet another embodiment, instead of multiple process windows being located on one proximity head, multiple proximity heads may be utilized to process the wafer where, for example, one proximity head may clean the wafer and another proximity head may dry the wafer according to the apparatuses and methodology described herein.

Figure 5B:
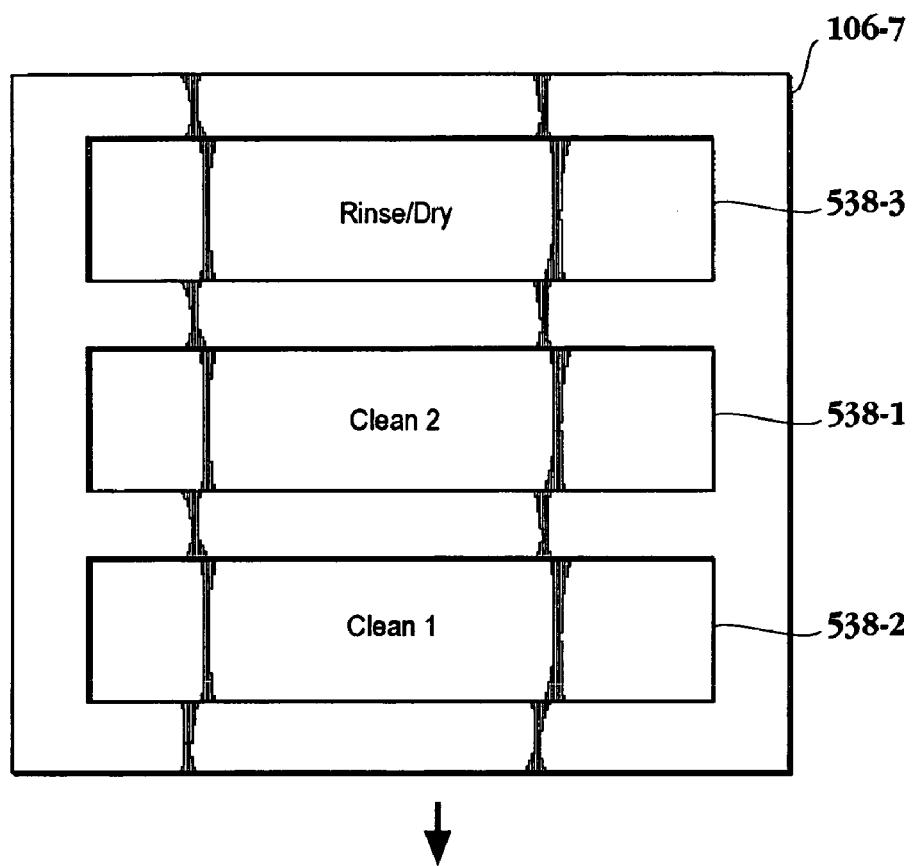
FIG. 5B shows a multi-process window proximity head with three process windows in accordance with one embodiment of the present invention.

FIG. 5B shows a multi-process window proximity head 106-7 with three process windows in accordance with one embodiment of the present invention. It should be appreciated that the proximity head 106-7 may include any suitable number of processing windows depending on the number and types of processing desired to be accomplished by the proximity head 106-7. In one embodiment, the proximity head 106-7 includes a process window 538-1, 538-2, and 538-3. In one embodiment, the process window 538-1, 538-2, and 538-3 are cleaning chemistry 1, cleaning chemistry 2, and rinsing/drying process windows respectively. In one embodiment, the process window 538-1 may form a meniscus made up of DIW to rinse a wafer surface. The process window 538-2 may generate a cleaning fluid meniscus to clean a wafer surface. The process windows 538-1 and 538-2 include at least one source inlet 306 to apply fluid to the wafer surface. In one embodiment, the process windows 538-1 and 538-2 may optionally include source inlet 302 and source outlet 304 to generate a stable and controllable fluid meniscus. The process window 538-3 may generate the fluid meniscus 116 to dry the wafer. It should be appreciated that the process window 538-3 both rinses and dries the wafer surface because the fluid meniscus is made up of DIW. Therefore, different types of process windows may be included in the proximity head 106-7. As discussed in reference to FIG. 5A above, instead of having multiple process windows in one proximity head, multiple proximity heads may be used where one or more of the proximity heads may be used for different purposes such as cleaning, rinsing, drying, etc.

Figure 6:
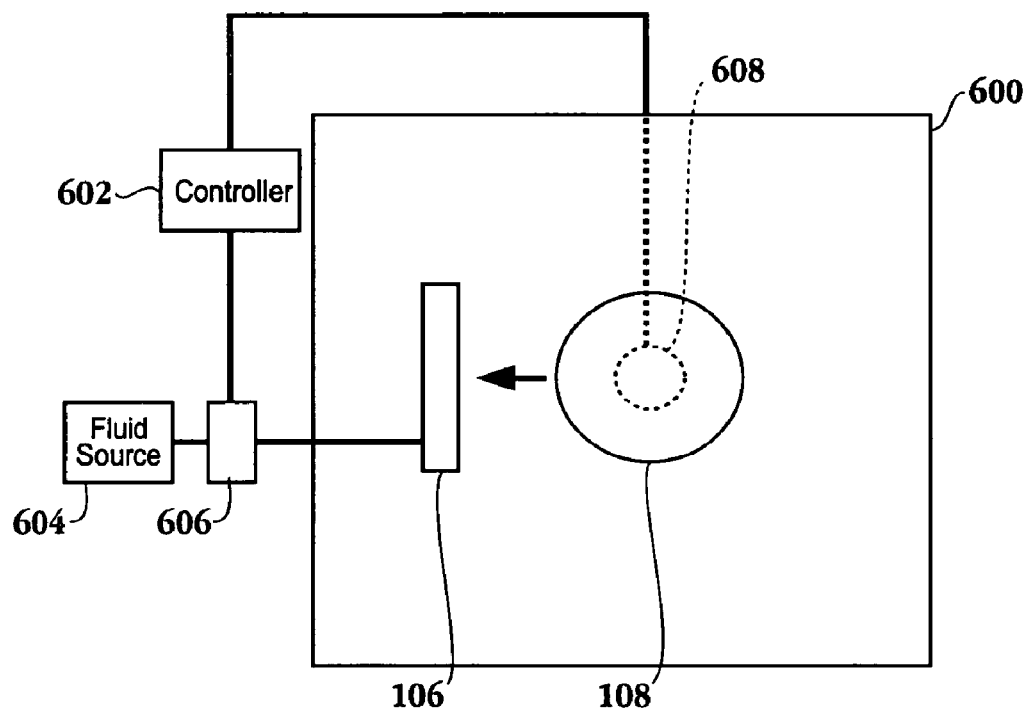
FIG. 6 is a high-level simplified schematic diagram of a single wafer cleaning system in accordance with one embodiment of the invention.

FIG. 6 is a high-level simplified schematic diagram of a single wafer cleaning system in accordance with one embodiment of the invention. Within chamber 600, wafer 108, which is supported by substrate support 608, and proximity head 106 is included. Substrate support 608 is used to move wafer 108 under proximity head 106. As FIG. 6 shows a top view of chamber 600, substrate support 608 is hidden by wafer 108. In one embodiment, substrate support 608 may be an alternative type of drive, e.g., one that supports the wafer along the edges, and moves the wafer under proximity head 106. It should be appreciated that any suitable drive mechanism may be used to move substrate support 608 and wafer 108 under proximity head 106. Alternatively, proximity head 106 may move across the wafer surface with wafer 108 being stationary. The system also includes controller 602, fluid source 604, and pump 606. Controller 602 is in communication with pump 606 and the drive mechanism for substrate support 608. In one embodiment, the linear velocity at which wafer 108 is moved under proximity head 106 is between about 1.0 millimeters per second and about 10 millimeters per second. At this velocity range, a single 200 mm wafer may be cleaned in less than 200 seconds, and in one embodiment, in less than 20 seconds. It should be appreciated that where wafer 108 is stationary and proximity head 106 moves, controller 602 will be in communication with the proximity head to control the movement.

Still referring to FIG. 6, heating the fluid source through a heating element either located within proximity head 106 or within the fluid source reservoir 604 may be used to raise the temperature of the cleaning chemistry. At the higher temperatures, the cleaning chemistry becomes more aggressive in removing a post-etch film from the surface of wafer 108. By controlling the rate at which the wafer moves on the proximity head 106, the residence time that the wafer is exposed to the cleaning chemistry can be controlled. It should be appreciated that the residue from the post-etch operations on surface of wafer 108 may be sensitive to temperature of the chemistry and less sensitive to the residence time of contact with the chemistry, however, the layer, e.g., dielectric film, over which the residue is disposed may be more sensitive to residence time of contact with the chemistry. Thus, by the system described above, both the residence time and the temperature of the cleaning chemistry may be controlled and optimized to ensure the residue is removed without damaging the dielectric layer. One skilled in the art will appreciate that multiple fluid sources may be used for the multiple windows illustrated with reference to FIGS. 5A and 5B.

Figure 7:
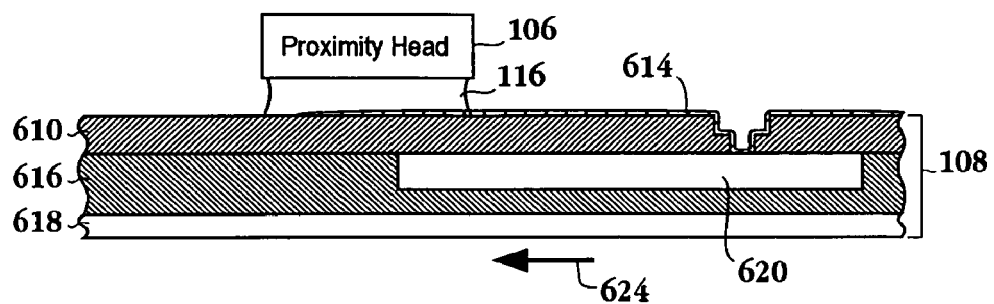
FIG. 7 is a cross-sectional simplified schematic diagram of the cleaning of a single wafer surface in accordance with one embodiment of the invention.

FIG. 7 is a cross-sectional simplified schematic diagram of the cleaning of a single wafer surface in accordance with one embodiment of the invention. Proximity head 106 is disposed over wafer 108. The layers of wafer 108 include substrate layer 618, low-K dielectric layer 616, copper layer 620 and low-K dielectric layer 610. Layer 614 is the post-etch or post-ashing residue left after an etching or ashing operation. Wafer 108 is being driven in the direction indicated by arrow 624. Here, the wafer would be driven by the substrate support referred to in FIG. 6. Meniscus 116 is disposed between a bottom surface of proximity head 106 and the top surface of wafer 108. The cleaning chemistry making up meniscus 116 is configured to remove the residue layer 614 from the top surface of wafer 108. As mentioned above, the rate at which wafer 108 is driven under proximity head 106 is controlled, as well as the temperature of the cleaning fluid within meniscus 612. It should be appreciated that pattern features within dielectric layer 610 will be cleaned through the embodiments described herein.

Figure 8:
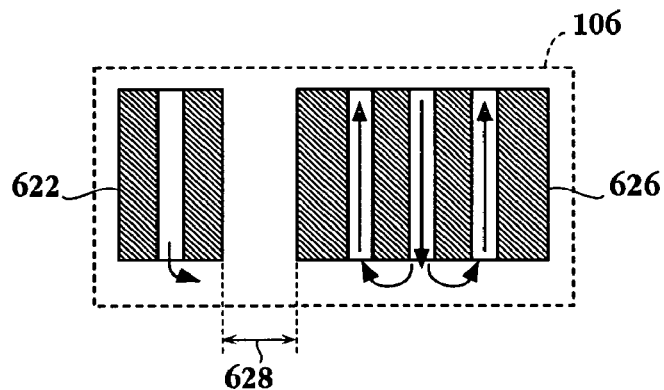
FIG. 8 is a simplified cross-sectional view of a proximity head that may be used to perform the cleaning of a single wafer surface in accordance with one embodiment of the invention.

FIG. 8 is a simplified cross-sectional view of a proximity head that may be used to perform the cleaning of a single wafer surface in accordance with one embodiment of the invention. Proximity head 106 may include two portions, such as the clean and rinse/dry portions illustrated with reference to FIG. 5A. Clean portion 626 will provide the cleaning chemistry meniscus as illustrated with reference to FIG. 7 in order to clean a residue from a surface of a substrate. Rinse section 622 will provide for the removal of any cleaning chemistry left by portion 626. Gap 628 which is defined by the trailing edge of portion 626 and the leading edge of portion 622 may be adjusted in order to further control the residence time experienced by the wafer surface being cleaned. Thus, the residence time may be controlled by the linear velocity at which the wafer is moving and by the dimension of gap 628.

Figure 9:
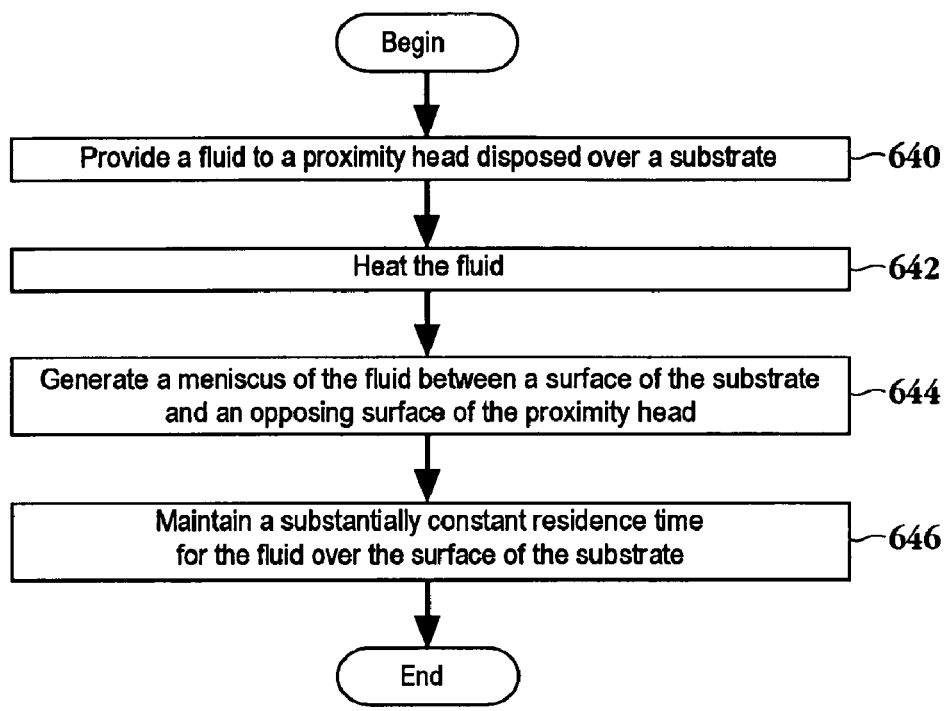
FIG. 9 is a flow chart diagram illustrating the method operations for removing post-processing residues in a single wafer cleaning system in accordance with one embodiment of the invention.

FIG. 9 is a flow chart diagram illustrating the method operations for removing post-processing residues in a single wafer cleaning system in accordance with one embodiment of the invention. The method initiates with operation 640 where a fluid is provided to a proximity head disposed over a substrate. It should be appreciated that more than one fluid may be applied to the proximity head where the proximity head has a cleaning portion and a rinse/dry portion as illustrated with reference to FIGS. 5A and 5B. The structure of the proximity head may be as discussed above and in corresponding co-owned patent applications referenced above. Furthermore, fluid may be pumped to the proximity head. In one embodiment, the flow rate of the fluid is about 40 milliliters per minute. The method then proceeds to operation 642 where the fluid is heated. The fluid may be heated through a heating element disposed within the proximity head in one embodiment. Alternatively, the reservoir containing the fluid may provide for heating the fluid. That is, the fluid may be heated by the proximity head or before the fluid is delivered to the proximity head. In one embodiment, the fluid is heated to temperatures between about 20° C. and 80° C. The method then advances to operation 644 where a meniscus of the fluid is generated between a surface of the substrate and an imposing surface of the proximity head. As described above with reference to FIG. 7, the meniscus is used to clean the post-etch residues from the surface of the wafer. Exemplary cleaning chemistries include non-aqueous solvents, semi-aqueous based chemistries and aqueous based chemistries. In one embodiment, the cleaning chemistries include chelators which assist in removing the post-etch residues.

The method of FIG. 9 then moves to operation 646 where a substantially constant residence time is maintained for the fluid over the surface of the substrate. In order to maintain the constant residence time, the rate at which the wafer is moved under the proximity head is maintained constant. In one embodiment, the wafer is not rotated but is just moved linearly under the proximity head. It should be appreciated that the proximity head may move relative to the wafer in another embodiment. That is, the wafer stays stationary in the proximity head moves over the top surface of the wafer at a constant rate. The residence time may also be controlled through the width of the gap discussed above with reference to FIG. 8.

Through the embodiments described above, the cleaning chemistry is optimized for selectivity between the residue and the layer on which the residue is disposed, by optimizing the residence time with chemical activity. The residence time maximizes the residue removal rate and minimizes damage to the later on which the residue is disposed, e.g., a low-dielectric film. Thus, as mentioned above, the residence time may be controlled by how fast or slow the wafer is moving under the proximity head or how wide of a meniscus is being used by the proximity head. The flow rate of the cleaning chemistry to the proximity head controls mass transport. In one embodiment, the residence time is less than 30 seconds and a flow rate delivered to the proximity head is less than 40 milliliters per minute. It should be appreciated that any suitable pump, e.g., a syringe pump, may be used to deliver such a flow rate to the proximity head. Furthermore, the residence time may be adjusted based on the activity of the cleaning chemistry. For example, the embodiments described herein enable the achievement of a residence time that is a fraction of a second. These embodiments also can operate at low flow rates of the expensive cleaning chemistries, thereby reducing costs and possibly eliminating the need for recycling.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for removing post processing residues in a single substrate cleaning system, comprising:
   providing a first fluid to an inlet of a proximity head disposed over a substrate;
   heating the first fluid in the proximity head;
   generating a meniscus of the first fluid between a surface of the substrate and an opposing surface of the proximity head;
   linearly moving the substrate under the proximity head and the meniscus to remove residues on the surface of the substrate, and
   controlling the moving of the substrate so that the meniscus of the first fluid contacts the surface of the substrate for less than 30 seconds.

2. The method of claim 1, further comprising:
   controlling the moving of the substrate so that the meniscus of the first fluid contacts the surface of the substrate for less than 2 seconds.

3. The method of claim 1, wherein the first fluid is heated to between about 20° C. and about 80° C.

4. The method of claim 1, further comprising:
   providing a second fluid to the proximity head, the second fluid being applied to a region of the substrate located behind an application area of the first fluid.

5. The method of claim 1, further comprising:
   maintaining a substantially constant residence time of the first fluid over the surface of the substrate as the substrate is moving.

6. The method of claim 1, wherein the substrate moves at a linear velocity between about 0.5 millimeters per second and about 10 millimeters per second.

7. The method of claim 4 wherein a gap between a leading edge of the application area and a leading edge of the second fluid region impacts a residence time of the first fluid with the surface of the substrate.

8. A method for removing post etch residues in a single substrate cleaning system, comprising method operation of:
   providing a fluid to an inlet of a proximity head disposed over a substrate;
   heating the fluid in the proximity head;
   generating a meniscus of the fluid between a surface of the substrate and an opposing surface of the proximity head;
   maintaining a substantially constant residence time of less than 30 seconds for the fluid over the surface of the substrate while removing the post etch residues.

9. The method of claim 8, wherein the method operation of heating the fluid includes,
   elevating a temperature of the fluid to greater than 35° C.

10. The method of claim 8, wherein the method operation of maintaining a substantially constant residence time of less than 30 seconds for the fluid over the surface of the substrate includes,
    adjusting a width of the meniscus to adjust the residence time.

11. The method of claim 8, wherein the method operation of providing a fluid to a proximity head disposed over a substrate includes,
    flowing the fluid to the proximity head at a flow rate of less than about 40 milliliters per minute.

12. The method of claim 8, further comprising:
    removing both inorganic and organic residues from the surface of the substrate during the residence time.

13. The method of claim 8, further comprising:
    rotating the substrate while radially moving the proximity head across the surface of the substrate.

* * * * *